United States Patent
Terashima et al.

(10) Patent No.: US 11,745,410 B2
(45) Date of Patent: Sep. 5, 2023

(54) IMPRINT APPARATUS AND METHOD FOR MANUFACTURING ARTICLE

(71) Applicant: CANON KABUSHIKI KAISHA, Tokyo (JP)

(72) Inventors: Shigeru Terashima, Utsunomiya (JP); Takahiro Nakayama, Haga-gun (JP); Yoichi Matsuoka, Shioya-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 205 days.

(21) Appl. No.: 16/422,726

(22) Filed: May 24, 2019

(65) Prior Publication Data

US 2019/0366619 A1 Dec. 5, 2019

(30) Foreign Application Priority Data

May 31, 2018 (JP) ................. 2018-104911

(51) Int. Cl.
  *G03F 7/00* (2006.01)
  *B29C 59/02* (2006.01)
  *B29C 43/56* (2006.01)
  *B29C 37/00* (2006.01)
  *H01L 21/027* (2006.01)
  *B29C 43/34* (2006.01)

(52) U.S. Cl.
  CPC ........ B29C 59/026 (2013.01); B29C 37/0053 (2013.01); B29C 43/56 (2013.01); G03F 7/0002 (2013.01); H01L 21/027 (2013.01); *B29C 2043/3411* (2013.01)

(58) Field of Classification Search
  CPC ............. B29C 2043/565; B29C 43/56; B29C 2791/006; G03F 7/0002
  See application file for complete search history.

(56) References Cited

U.S. PATENT DOCUMENTS

2012/0188536 A1 * 7/2012 Sato ............... G01N 21/94
                                                  118/712
2019/0265586 A1 * 8/2019 Jung ............... B29C 35/0888

FOREIGN PATENT DOCUMENTS

| JP | 2011-169807 A | 9/2011 |
| JP | 2013-26474 A | 2/2013 |
| JP | 2013-038191 A | 2/2013 |
| JP | 2013-175656 A | 9/2013 |
| JP | 2014-225582 A | 12/2014 |
| JP | 2016-111062 A | 6/2016 |
| JP | 2017-157635 A | 9/2017 |
| JP | 2018-006387 A | 1/2018 |
| KR | 2012-0102014 A | 9/2012 |

OTHER PUBLICATIONS

JP2013026474 machine translation (Year: 2013).*

* cited by examiner

*Primary Examiner* — Alison L Hindenlang
*Assistant Examiner* — Alexander A Wang
(74) *Attorney, Agent, or Firm* — Canon U.S.A., Inc., IP Division

(57) ABSTRACT

An imprint apparatus that forms a pattern of an imprint material on a substrate with use of a mold includes a mold holding unit configured to hold the mold, a suction unit provided at the mold holding unit and configured to suction a gas in a space in which the mold and the substrate face each other, a detector configured to detect particles included in the gas suctioned by the suction unit, and a control unit configured to perform error processing depending on a result of detection performed by the detector.

10 Claims, 7 Drawing Sheets

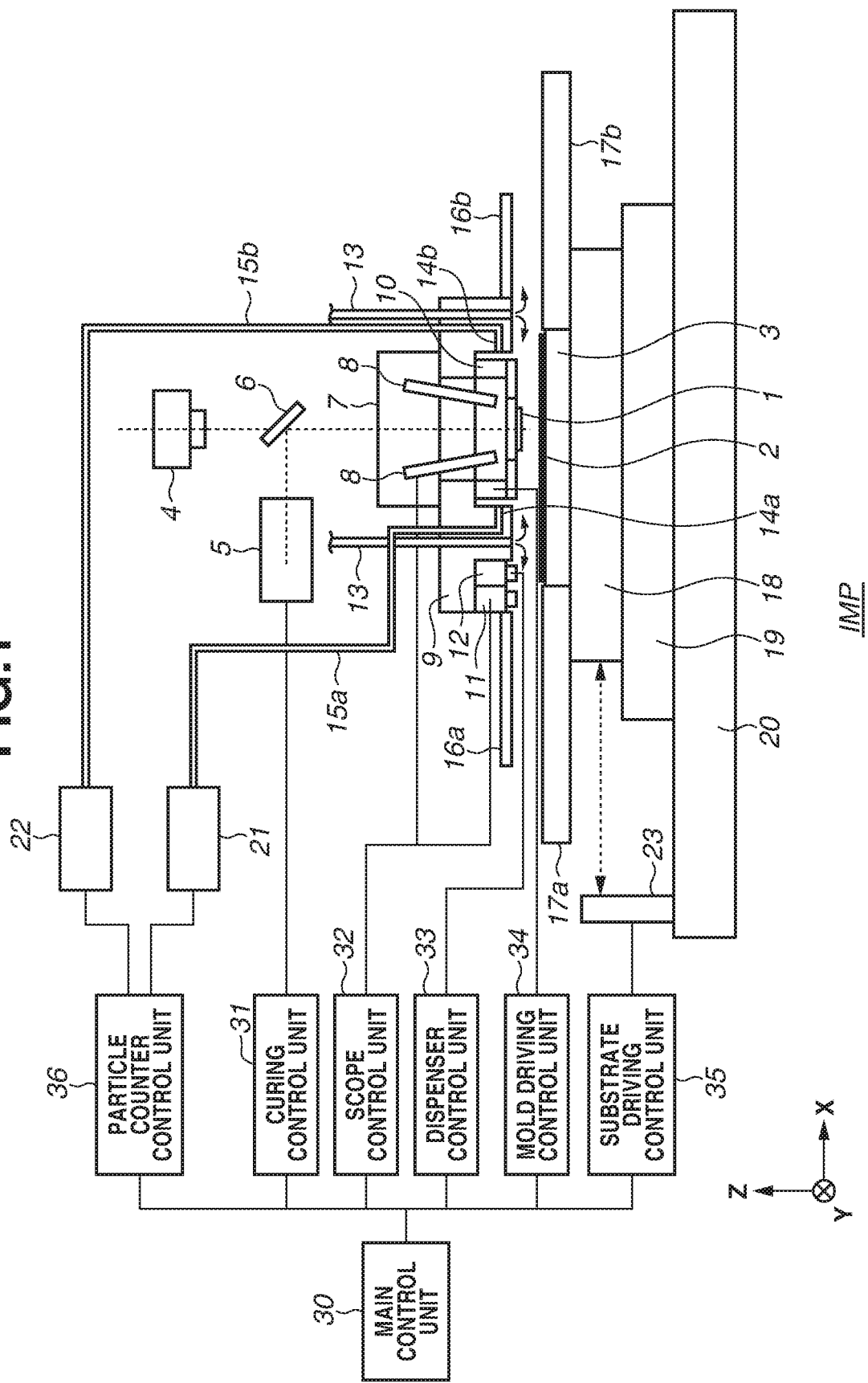

IMPRINT APPARATUS AND METHOD FOR MANUFACTURING ARTICLE

BACKGROUND

Field of the Disclosure

Aspects of the disclosure invention generally relate to an imprint apparatus and a method for manufacturing an article.

Description of the Related Art

Known methods for manufacturing an article, such as a semiconductor device or a microelectromechanical system (MEMS), include an imprint method of molding an imprint material on a substrate with use of a mold. The imprint method supplies an imprint material onto a substrate and brings the supplied imprint material into contact with a mold (performs imprinting). After hardening (curing) the imprint material while keeping the imprint material and the mold in contact with each other, the imprint method releases the mold from the cured imprint material (performs mold release), so that a pattern of the imprint material is formed on the substrate.

An imprint apparatus is a substrate processing apparatus that performs processing for forming a microscopic structural object on a substrate, and particles adhering to the substrate may cause, for example, a faulty pattern or a breakage of a pattern portion of the mold. Moreover, in a case where particles included in a gas inside the substrate processing apparatus have increased, the possibility of particles adhering to the substrate becomes high. Therefore, in order to determine whether the possibility of particles adhering to the substrate has become high, it is being demanded to measure particles included in the gas inside the substrate processing apparatus.

Japanese Patent Application Laid-Open No. 2013-26474 discusses a method of providing an imprint system with a detector that detects the concentration of particles in a space in which imprint processing is performed and of, when the detected concentration of particles exceeds a reference value, increasing a gas supply amount, thus decreasing the concentration of particles. Moreover, some imprint apparatuses have a configuration in which particles are unlikely to enter a space in which the mold and the substrate face each other. Japanese Patent Application Laid-Open No. 2016-111062 discusses an imprint apparatus in which an enclosure forming approximately the same plane as that of the mold is provided around the mold and which moves the substrate while supplying a gas in which the concentration of particles has been decreased from a gas supply port located around the mold. This configuration causes a gas including particles to become unlikely to enter a space between the mold and the substrate from the outside space.

The method of detecting particles inside the imprint apparatus, as discussed in Japanese Patent Application Laid-Open No. 2013-26474, requires time until detecting particles generated in a space in which the mold and the substrate face each other or in the surrounding space. Moreover, this method detects particles when the particles are spreading and attenuating inside the apparatus and is, therefore, unable to accurately detect the state of generation of particles in a space in which the mold and the substrate face each other. In the imprint apparatus discussed in Japanese Patent Application Laid-Open No. 2016-111062, a space in which the mold and the substrate face each other is kept in a cleaner state than the surrounding space. Therefore, particles generated in the surrounding space (outside space) are unlikely to enter the space in which the mold and the substrate face each other, and, even if particles are detected in such an outside space, there may be no influence on pattern formation. If the apparatus is stopped when particles have been detected in the outside space, productivity would be lowered.

SUMMARY

According to an aspect of the present invention, an imprint apparatus that forms a pattern of an imprint material on a substrate with use of a mold includes a mold holding unit configured to hold the mold, a suction unit provided at the mold holding unit and configured to suction a gas in a space in which the mold and the substrate face each other, a detector configured to detect particles included in the gas suctioned by the suction unit, and a control unit configured to perform error processing depending on a result of detection performed by the detector.

Further features of the present invention will become apparent from the following description of exemplary embodiments with reference to the attached drawings.

BRIEF DESCRIPTION OF THE DRAWINGS

FIG. 1 is a diagram schematically illustrating a configuration of an imprint apparatus according to a first exemplary embodiment of the present invention.

DESCRIPTION OF THE EMBODIMENTS

Figure 2A:
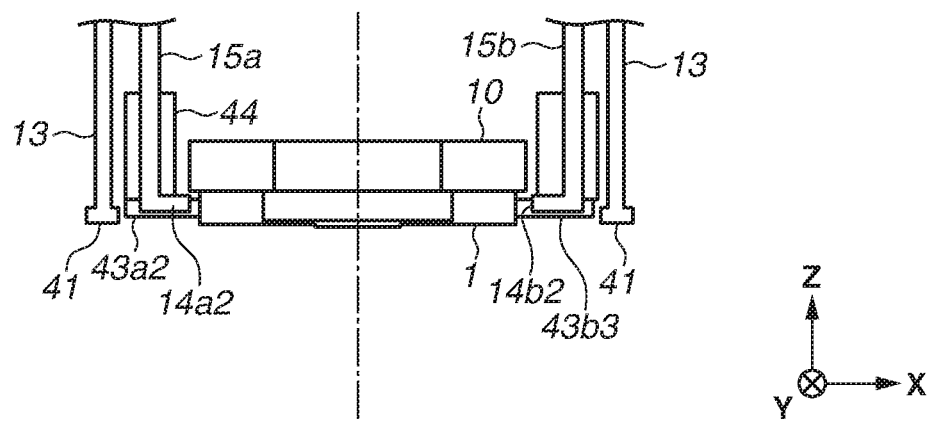
FIGS. 2A and 2B are a sectional view and a plan view of a mold holding unit according to the first exemplary embodiment.

Various exemplary embodiments, features, and aspects of the invention will be described in detail below with reference to the drawings. Furthermore, in the respective figures, the same members are assigned the respective same reference numbers and the duplicated description thereof is omitted. While an imprint apparatus is described, the present invention can be applied to not only the imprint apparatus but also any lithography apparatuses which have an issue that particles may adhere to a stage member located around a wafer.

FIG. 1 schematically illustrates a configuration of an imprint apparatus IMP according to a first exemplary embodiment. The imprint apparatus IMP forms a pattern on a substrate 2 with use of a mold 1. More specifically, the imprint apparatus IMP brings the mold 1 into contact with an imprint material on the substrate 2, and then cures (hardens) the imprint material, thus forming a pattern made from a hardened object of the imprint material. Then, the imprint apparatus IMP separates the pattern, which is made from a hardened object of the imprint material, and the mold 1 from each other. In this way, the imprint apparatus IMP is an apparatus which brings an imprint material supplied onto a substrate into contact with a mold and gives energy for curing to the imprint material, thus forming a pattern of the hardened object onto which a raised and recessed pattern of the mold has been transferred.

The imprint material to be used includes a curable composition (also referred to as an "uncured resin"), which is cured (hardened) by receiving energy for curing. The energy for curing to be used includes, for example, electromagnetic wave and heat. The electromagnetic wave can be, for example, light selected from rays of light with wavelengths in the range of 10 nanometers (nm) to 1 millimeter (mm), inclusive, such as infrared light, visible light, or ultraviolet light. The curable composition can be a composition which is cured by irradiation of light or by heating. Among such compositions, a photo-curable composition, which is cured by irradiation of light, contains at least a polymerizable compound and a photopolymerization initiator, or, as needed, can further contain a non-polymerizable compound or a solvent. The non-polymerizable compound is at least one type selected from the group including, for example, a sensitizer, a hydrogen donor, an internal mold release agent, a surface-active agent, an antioxidizing agent, and a polymer component. The imprint material can be applied onto substrate in a film shape by a spin coater or a slit coater. Moreover, the imprint material can be placed on the substrate in a droplet shape or in the shape of an island or a film obtained by a plurality of droplets being connected together. The viscosity (the viscosity at 25° C.) of the imprint material can be, for example, 1 mPa·s or more and 100 mPa·s or less.

The material of the substrate 2 to be used includes, for example, glass, ceramic, metal, semiconductor, and resin. As needed, a member made from a material different from that of the substrate can be provided on the surface of the substrate. The substrate is, for example, a silicon wafer, a compound semiconductor wafer, or quartz glass.

The mold 1 is used to mold an imprint material on a substrate. The mold 1 can also be called a form, a template, or an original plate. The mold 1, which has a rectangular outline shape, has a pattern region with a pattern (a raised or recessed pattern or a circuit pattern) to be transferred to the imprint material on the substrate 2 formed therein. The mold 1 is made from a material which allows energy for curing the imprint material on the substrate to pass therethrough, such as quartz. Moreover, an alignment mark, which is used for alignment with the substrate 2, is formed on the mold 1.

In the present specification and the accompanying drawings, directions are specified in an XYZ coordinate system in which directions parallel to the surface of the substrate 2 correspond to an XY plane. Directions parallel to the X axis, Y axis, and Z axis in the XYZ coordinate system are defined as an X direction, Y direction, and Z direction, respectively, and a rotation around the X axis, a rotation around the Y axis, and a rotation around the Z axis are defined as θX, θY, and θZ, respectively. Control or drive about the X axis, Y axis, and Z axis means control or drive about a direction parallel to the X axis, a direction parallel to the Y axis, and a direction parallel to the Z axis, respectively. Moreover, control or drive about the θX axis, θY axis, and θZ axis means control or drive about a rotation around an axis parallel to the X axis, a rotation around an axis parallel to the Y axis, and a rotation around an axis parallel to the Z axis, respectively. Moreover, a position is information that is able to be specified based on coordinates of the X axis, Y axis, and Z axis, and an orientation is information that is able to be specified based on values of the θX axis, θY axis, and θZ axis. Positioning means controlling the position and/or orientation. Position adjustment can include controlling the position and/or orientation of at least one of the substrate and the mold.

With regard to driving (positioning) of the substrate 2, the imprint apparatus IMP includes a substrate holding unit 3, substrate surrounding members 17 (17a and 17b), a fine movement stage 18, a coarse movement stage 19, a stage support body 20, a measurement device 23, and a substrate driving control unit 35. In this example, a stage is configured with the fine movement stage 18 and the coarse movement stage 19. The coarse movement stage 19 is supported by the stage support body 20 and is driven by a stage driving unit (not illustrated). The fine movement stage 18 is supported by the coarse movement stage 19 and is driven by a fine driving mechanism (not illustrated). The substrate holding unit 3 is mounted on the fine movement stage 18. The substrate holding unit 3 holds the substrate 2. The substrate surrounding members 17 are located at the periphery of the substrate holding unit 3 or the substrate 2 and are supported by the fine movement stage 18. The substrate surrounding members 17 are located at approximately the same height as the surface of the substrate 2 around the substrate 2. The position and orientation of the fine movement stage 18 are measured by the measurement device 23. The substrate driving control unit 35 controls a stage driving unit and a fine movement mechanism based on the position and orientation of the fine movement stage 18 measured by the measurement device 23, thus controlling the position and orientation of the fine movement stage 18 (substrate 2). The fine movement stage 18 (substrate 2) is able to be driven with respect to a plurality of axes (for example, three axes, i.e., the X axis, Y axis, and θZ axis, or, desirably, six axes, i.e., the X axis, Y axis, Z axis, θX axis, θY axis, and θZ axis).

With regard to driving of the mold 1, the imprint apparatus IMP includes a mold driving unit 10 and a mold driving control unit 34. The mold driving unit 10 holds the mold 1 and is configured to drive the mold 1 with respect to a plurality of axes (for example, three axes, i.e., the Z axis, θX axis, and θY axis, or, desirably, six axes, i.e., the X axis, Y axis, Z axis, θX axis, θY axis, and θZ axis). The mold driving control unit 34 controls driving of the mold 1 performed by the mold driving unit 10. For example, the mold driving control unit 34 controls the mold driving unit 10 in such a manner that the imprint material on a shot region of the substrate 2 and the pattern region (a region with a pattern to be transferred to the substrate or the imprint member formed therein) of the mold 1 come into contact with each other. Moreover, for example, the mold driving control unit 34 controls the mold driving unit 10 in such a manner that the pattern formed from the hardened object of the imprint material and the pattern region of mold 1 are separated from each other.

With regard to measurement for position adjustment between the substrate 2 (the shot region thereof) and the mold 1, the imprint apparatus IMP includes an alignment scope 8, an alignment scope 11, and a scope control unit 32. The alignment scope 8 is mounted in an imprint head 7, and detects a relative position and relative orientation between a mark of the mold 1 and a mark of the shot region of the substrate 2. The alignment scope 11 is an off-axis alignment scope, and detects the position of a mark of the shot region of the substrate 2. Detecting the positions of marks of a plurality of shot regions of the substrate 2 with the alignment scope 11 enables measuring the array of shot regions on the substrate 2. The alignment scope 8 detects a mark of the substrate 2 via the mold 1, and the alignment scope 11 detects a mark of the substrate 2 without via the mold 1. The alignment scope 8 and the alignment scope 11 are able to detect reference marks (not illustrated) provided on a substrate stage which holds the substrate 2. The scope control unit 32 controls the alignment scope 8 and the alignment scope 11. The imprint apparatus IMP further includes a camera 4. For example, the camera 4 is used to observe a contact state between the imprint material on the short region of the substrate 2 and the pattern region of the mold 1.

With regard to a configuration for placing an imprint material on the substrate 2, the imprint apparatus IMP includes a dispenser 12 (imprint material supply unit) and a dispenser control unit 33. The dispenser 12 ejects an imprint material toward the substrate 2. When an imprint material is ejected from the dispenser 12 while the substrate 2 is scanned and driven by the stage driving unit and the fine movement mechanism, the imprint material is placed on the substrate 2. The dispenser control unit 33 controls ejection of an imprint material from the dispenser 12. In the case of an imprint apparatus IMP which forms a pattern in each of a plurality of shot regions of the substrate 2, the substrate driving control unit 35 causes the substrate 2 to be scanned and driven between the mold 1 and the dispenser 12 along the scanning direction (X direction).

With regard to curing of the imprint material, the imprint apparatus IMP includes a curing unit 5, an optical system 6, and a curing control unit 31. In a state in which the imprint material on the short region of the substrate 2 and the pattern region of the mold 1 have come into contact with each other and the recessed portions of the pattern region have been filled with the imprint material, the curing unit 5 irradiates the imprint material with energy for curing, thus curing the imprint material. The curing unit 5 is configured to irradiate the imprint material with light energy such as ultraviolet light as the energy for curing. For example, the curing unit 5 is a light source which radiates ultraviolet light. The optical system 6 is used to irradiate the imprint material with energy for curing emitted from the curing unit 5. For example, the optical system 6 is an optical element (beam splitter) which has the property of reflecting light coming from the curing unit 5 and transmitting light coming from the camera 4. The curing control unit 31 controls the curing unit 5.

With regard to a configuration for supplying a gas to a space in which the mold 1 and the substrate 2 face each other (a space surrounded by the mold 1 and the substrate 2), the imprint apparatus IMP includes a gas supply unit 13. A gas supply port of the gas supply unit 13 is located around the mold 1, so that a clean gas in which particles have been removed is able to be supplied during the process of operation of the imprint apparatus IMP. The gas supply port of the gas supply unit 13 is connected to a clean air supply system (not illustrated).

The imprint apparatus IMP further includes suction units 14 (14a and 14b), which are located outside the mold 1 and suction a gas present around the mold 1. Each suction unit 14 is able to suction a gas present around the mold 1 so as to measure particles included in a gas present outside the mold 1.

The imprint apparatus IMP further includes pipes 15 (15a and 15b), which guide a gas suctioned by the suction units 14 (14a and 14b) to particle counters 21 and 22 (particle detectors). Each of the particle counters 21 and 22 connected to the pipes 15 measures the number of particles present in the gas suctioned by the suction units 14. Each of the particle counters 21 and 22 is controlled by a particle counter control unit 36 and measures the number of particles for every set time (unit time) or for every set volume of the suctioned gas (unit volume).

Additionally, the imprint apparatus IMP further includes mold surrounding members 16 (16a and 16b) provided around a mold holding unit. The mold surrounding members 16 are provided in such a manner that, even when the relative position between the mold 1 and the substrate 2 changes due to movement of the substrate 2 along the pattern surface of the mold 1 and, thus, the mold 1 is not present at a position facing the substrate 2, the substrate 2 and the mold surrounding members 16 form almost the same clearance as that formed by the substrate 2 and the mold 1 facing each other. The mold surrounding members 16 are provided in such a way as to cover a region in which the substrate 2 moves during a period when a pattern is sequentially formed by imprinting on the substrate 2.

Besides, the imprint apparatus IMP further includes an upper portion support body 9, which supports, for example, the alignment scope 11, the dispenser 12, the mold driving unit 10, the alignment scope 8, the curing unit 5, the optical system 6, and the camera 4. Moreover, the upper portion support body 9 can be provided with the gas supply unit 13, the suction units 14, the pipes 15, and the particle counters 21 and 22. The imprint apparatus IMP further includes a main control unit 30 (control unit), which controls the curing control unit 31, the scope control unit 32, the dispenser control unit 33, the mold driving control unit 34, the substrate driving control unit 35, and the particle counter control unit 36. At least some of the curing control unit 31, the scope control unit 32, the dispenser control unit 33, the mold driving control unit 34, the substrate driving control unit 35, and the particle counter control unit 36 can be incorporated in the main control unit 30. The main control unit 30 can be configured with a programmable logic device (PLD) such as a field programmable gate array (FPGA), an application specific integrated circuit (ASIC), a general-purpose computer in which a program is incorporated, or a combination of all or some of these elements. The main control unit 30 can be provided inside the imprint apparatus IMP or can be installed at a position different from that of the imprint apparatus IMP to be used for remote control.

Figure 2B:
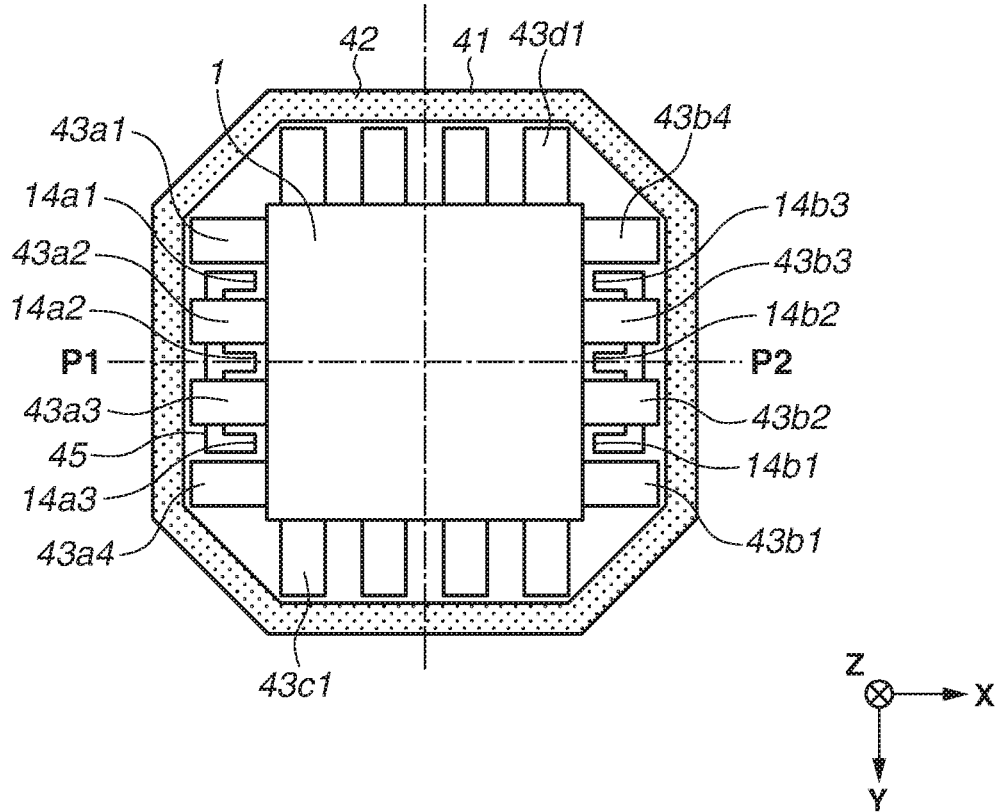

A method of detecting particles in the first exemplary embodiment is described with reference to FIG. 1 and FIGS. 2A and 2B. FIGS. 2A and 2B illustrate a mold holding unit located around the mold 1, with FIG. 2A being a sectional view of the mold 1 and the mold holding unit and FIG. 2B being a plan view of the mold 1 and the mold holding unit as viewed from below the mold 1. FIG. 2A illustrates a cross-section taken along line P1-P2 in FIG. 2B. As illustrated in FIGS. 2A and 2B, a gas supply port 41, which blows the air supplied from the gas supply unit 13 toward the substrate 2, is provided around the mold 1. The gas supply port 41 is located in such a way as to surround the mold 1, as illustrated in FIG. 2B. A great number of small holes 42 are formed on a surface of the gas supply port 41 facing the substrate 2, so that the gas supply port 41 has such a structure as to blow the clean air with particles removed therefrom to the surface of the substrate 2 in a dispersed manner. The diameter of each small hole 42 is about 0.01 mm to 2 mm, and the small holes 42 are arranged in such a way as to blow air from the whole surface of the gas supply port 41 as evenly as possible.

Moreover, at the side surfaces of the mold 1, a mold deforming mechanism 43, which applies force to the side surfaces of the mold 1 so as to correct the shape (for example, magnification) of the mold 1, is located. The mold deforming mechanism 43 is configured with, for example, a piezoelectric actuator, and is supported by a support unit 44, which is a part of the mold holding unit. A plurality of suction units 14 (14a1, 14a2, and 14a3) is located between the mold deforming mechanisms 43 (43a1, 43a2, 43a3, and 43a4), and each opening (suction port) thereof faces the side surface of the mold 1. The gases suctioned from the suction units 14 (14a1, 14a2, and 14a3) are collected together to a communicating tube 45 and are then conveyed to the particle counter 21 via the pipe 15a. Similarly, a plurality of suction units 14 (14b1, 14b2, and 14b3) is located between a plurality of mold deforming mechanisms 43 (43b1, 43b2, 43b3, and 43b4). The gases suctioned from the suction units 14 (14b1, 14b2, and 14b3) are conveyed to the particle counter 22 via the pipe 15b.

The suction units 14 (14a and 14b), which are connected to the particle counters 21 and 22 in the first exemplary embodiment, are arranged at the right and left sides in such a way as to face each other across the mold 1. The substrate 2 is moved leftward (in the −X direction) to below the dispenser 12 (supply unit), which supplies an imprint material to shot regions of the substrate 2, and, after the imprint material is supplied, the substrate 2 is moved rightward (in the +X direction) to below the mold 1. The imprint apparatus IMP repeats supplying of an imprint material and formation of a pattern with respect to a plurality of shot regions of the substrate 2. Here, the direction along which the mold 1 and the dispenser 12 are arranged is defined as a scanning direction (X direction). It is desirable that the above-mentioned suction units 14 be arranged along the scanning direction.

In conjunction with the movement of the substrate 2, a gas present around the imprint head 7 is caught up by the substrate 2 and is thus caused to enter a clearance between the mold 1 and the substrate 2. The suction units 14 being arranged along the scanning direction enables promptly recognizing whether particles are included in a gas which is caught up by the substrate 2 and is thus caused to enter a clearance between the mold 1 and the substrate 2. In this way, while it is desirable that the suction units 14 be arranged along the scanning direction in such a way as to face each other across the mold 1, at the left side of the mold 1 in FIG. 1, the suction unit 14 only needs to be arranged at least between the dispenser 12 and the mold 1. Arranging the suction unit 14 between the dispenser 12 and the mold 1 enables detecting particles in a gas caught up by the substrate 2.

Moreover, in FIG. 1 and FIGS. 2A and 2B, the pipes 15a and 15b continuing from the suction units 14a and 14b located at the left and right sides of the mold 1 (positions facing each other across the mold 1 along the scanning direction) are respectively connected to the separate particle counters 21 and 22. However, the piles 15a and 15b can be brought together so as to be subjected to measurement by a single particle counter. Additionally, while, in the first exemplary embodiment, three suction units (14a1, 14a2, and 14a3) are arranged at the side surface on one side of the mold 1, the first exemplary embodiment is not limited to this, but one suction unit only needs to be arranged near the center thereof, or another number of suction units can be arranged.

Figure 5:
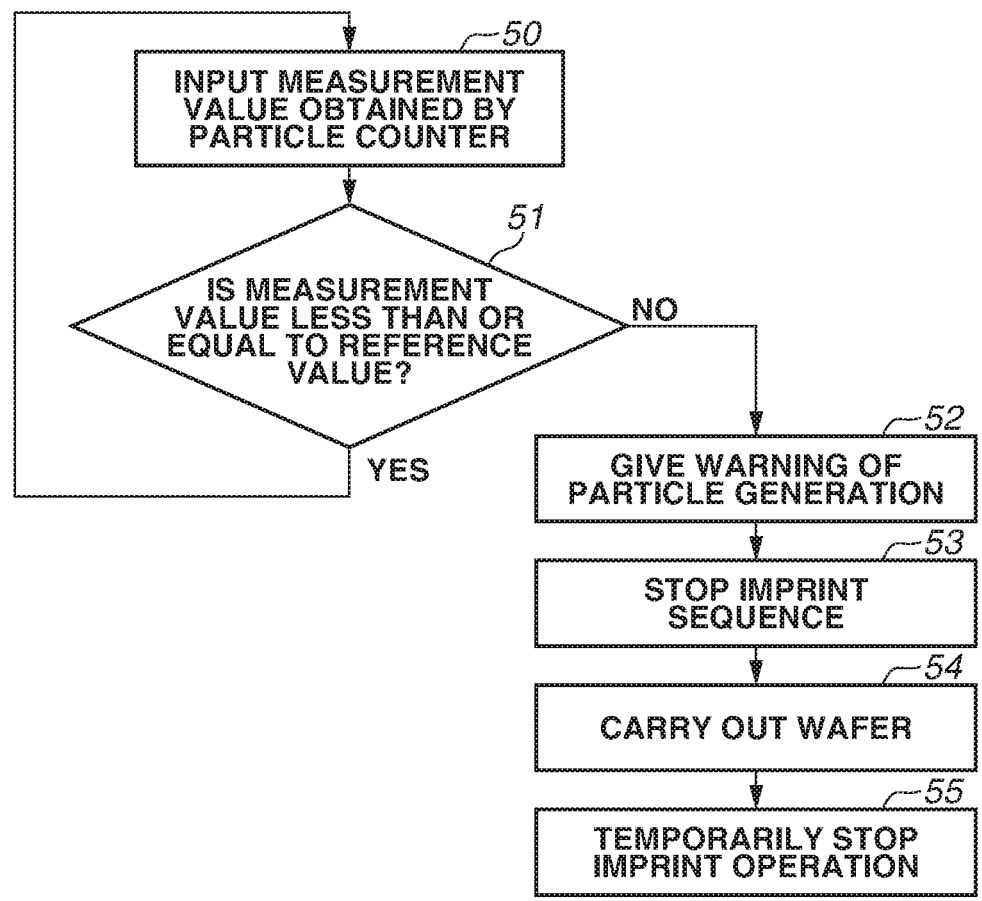
FIG. 5 is a flowchart illustrating detection of particles in the first exemplary embodiment.

FIG. 5 is a flowchart illustrating detection of particles in the first exemplary embodiment. Each of the particle counters 21 and 22 measures (counts) the number of particles included in a gas present around the mold 1 (in an imprint space) during the process of operation of the imprint apparatus IMP. In step 50, the imprint apparatus IMP inputs a measurement value obtained by the particle counter. The particle counter sends a numerical value about the particles measured for every previously set time or for every previously set volume of the suctioned gas (a result of detection) to the particle counter control unit 36. In step 51, a determination unit (not illustrated) included in the particle counter control unit 36 compares the measurement value with a previously set numerical value, and, if the number of particles larger than the numerical value has been counted (NO in step 51), the determination unit determines that abnormal particle generation has occurred, and then notifies the main control unit 30 of the occurrence of abnormal particle generation. In step 52, the main control unit 30, which has received a notification of the occurrence of abnormal particle generation, gives a warning of the occurrence of apparatus abnormal situation (performs error processing). For example, the main control unit 30 displays such a warning content on a display unit such as an operation screen provided in the imprint apparatus IMP.

Then, in step 53, the imprint apparatus IMP promptly stops an imprint sequence which is in process, and performs a stopping operation (performs error processing) such as an operation of moving the substrate from a substrate chuck to another place. Then, in step 54, the imprint apparatus IMP carries out the substrate to the outside of the imprint apparatus IMP, and, in step 55, the imprint apparatus IMP temporarily stops an imprint operation of the imprint apparatus IMP. The operator of the imprint apparatus IMP can check the pattern state of the substrate processed at the time of issuance of the warning or take out the mold from the apparatus and check the pattern of the mold. In this way, the operator temporarily stops the imprint apparatus IMP, performs checking of the state of generation of particles, such as checking of the state of particles adhering to the mold or the substrate, and, as needed, takes measures to remove particles by, for example, cleansing the apparatus.

Accordingly, the imprint apparatus according to the first exemplary embodiment is able to detect particles generated near the mold, which influence pattern formation, and is able to stop an imprint operation so as to reduce the occurrence of pattern defects caused by the particles.

Figure 3:
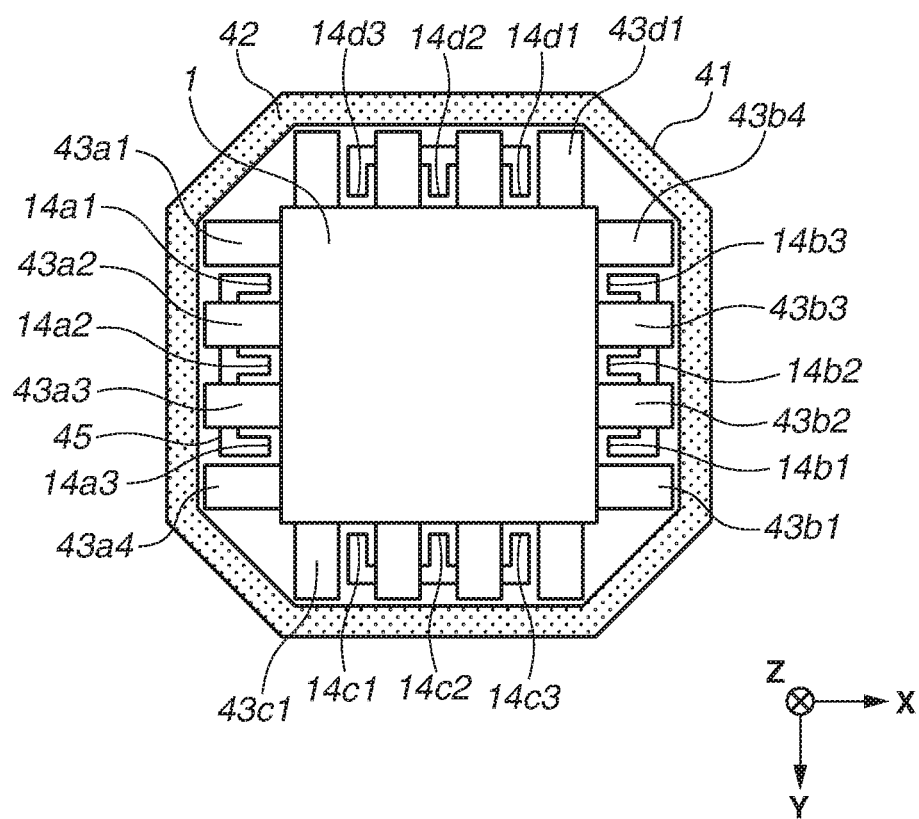
FIG. 3 is a plan view of a mold holding unit according to a second exemplary embodiment of the present invention.

FIG. 3 illustrates suction units 14 provided in an imprint apparatus IMP according to a second exemplary embodiment. Here, constituent elements different from those of the suction unit in the first exemplary embodiment are described. The other constituent elements of the imprint apparatus in the second exemplary embodiment are similar to those of the imprint apparatus in the first exemplary embodiment, and are, therefore, omitted from description.

As illustrated in FIG. 3, the suction units 14 in the second exemplary embodiment are arranged in such a way as to surround the mold 1. The suction units 14 connected to the particle counters 21 and 22 in the second exemplary embodiment include, in addition to suction units (14a1, 14a2, and 14a3 and 14b1, 14b2, and 14b3) arranged along the scanning direction (X direction), suction units (14c1, 14c2, and 14c3 and 14d1, 14d2, and 14d3) arranged at the upper and lower sides along the Y direction in such a way as to face each other across the mold 1. In this way, the suction units 14 of the imprint apparatus in the second exemplary embodiment are located at positions facing the respective four side surfaces of the mold 1.

Even in a case where the substrate 2 is moved along a direction perpendicular to the scanning direction with respect to the mold 1, the imprint apparatus is able to promptly recognize whether particles are included in a gas which is caught up by the substrate 2 in conjunction with the movement of the substrate 2 and is thus caused to enter a clearance between the mold 1 and the substrate 2.

Figure 4A:
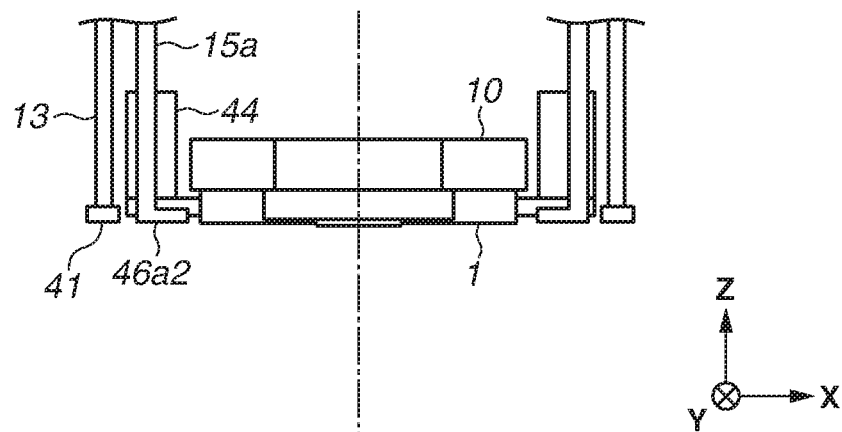
FIGS. 4A and 4B are a sectional view and a plan view of a mold holding unit according to a third exemplary embodiment of the present invention.
Figure 4B:
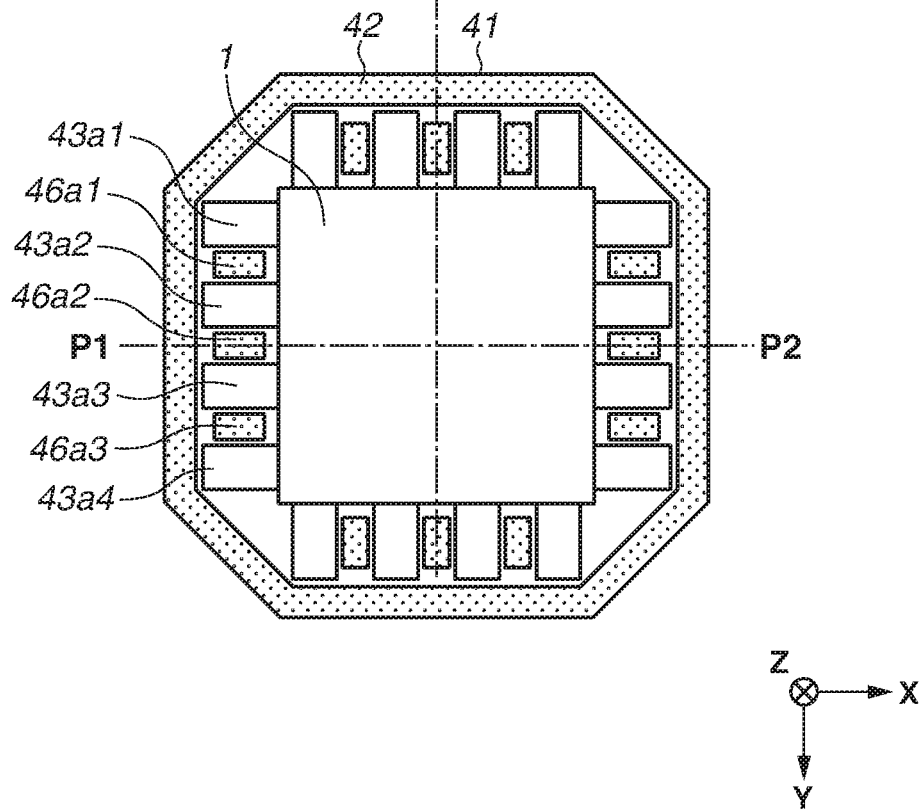

FIGS. 4A and 4B illustrate suction units 46 provided in an imprint apparatus IMP according to a third exemplary embodiment. Here, constituent elements different from those of the suction unit in the first exemplary embodiment are described. The other constituent elements of the imprint apparatus in the third exemplary embodiment are similar to those of the imprint apparatus in the first exemplary embodiment, and are, therefore, omitted from description.

In the suction units 14 illustrated in FIGS. 2A and 2B and FIG. 3, openings (suction ports) used to suction a gas are formed in such a way as to face the side surfaces of the mold 1. On the other hand, in the suction units 46 in the third exemplary embodiment, openings used to suction a gas are formed in such a way as to face the surface of the substrate 2. FIG. 4A is a sectional view of the mold holding unit taken along line P1-P2 in a plan view thereof illustrated in FIG. 4B. FIG. 4B is a view of the mold 1 held by the mold holding unit as viewed from the substrate 2. The suction units 46 (46a1, 46a2, and 46a3) are arranged around the mold 1. In the suction units 46, suction ports (openings used to suction a gas) composed of a great number of small holes are formed in such a way as to face the surface of the substrate 2. In a case where the suction ports of the suction units 46 are placed in such a way as to face the substrate 2, if a single suction unit 46 (suction port) or several suction units 46 (suction ports) are arranged, air currents may become fast near each suction port used to suction a gas. Therefore, since an imprint material applied to the substrate 2 may be affected, it is favorable that each suction unit has a great number of small holes in a dispersed manner.

In this way, the suction units 46 of the imprint apparatus in the third exemplary embodiment are arranged at the respective four side surfaces of the mold 1, and the gas suction ports used to suction a gas are formed at positions facing the surface of the substrate 2. Even in a case where the substrate 2 is moved along the scanning direction and a direction perpendicular thereto with respect to the mold 1, the imprint apparatus is able to promptly recognize whether particles are included in a gas which is caught up by the substrate 2 in conjunction with the movement of the substrate 2 and is thus caused to enter a clearance between the mold 1 and the substrate 2.

Figure 6:
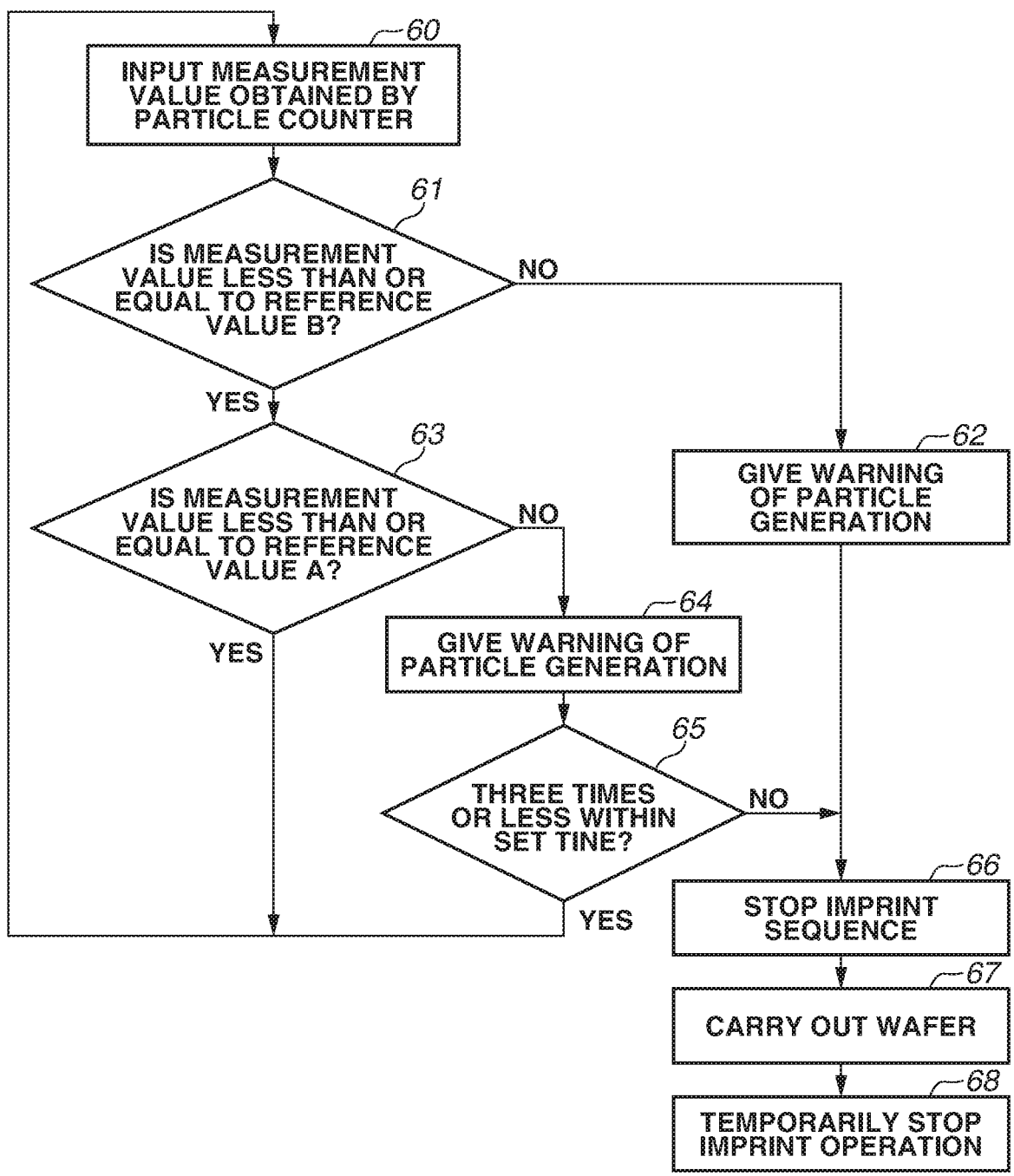
FIG. 6 is a flowchart illustrating detection of particles in a fourth exemplary embodiment of the present invention.

FIG. 6 is a flowchart illustrating detection of particles in a fourth exemplary embodiment. In the fourth exemplary embodiment, an example in which a criterion for determining a result of measurement performed by each of the particle counters 21 and 22 is different from the determination criterion described with reference to FIG. 5 is described. The configuration of an imprint apparatus in the fourth exemplary embodiment is the same as that described in the first exemplary embodiment.

Each of the particle counters 21 and 22 measures (counts) the number of particles included in a gas present around the mold 1 (in an imprint space) during the process of operation of the imprint apparatus IMP. Each of the particle counters 21 and 22 has, as one of the functions thereof, a function of counting particles included in a gas for respective different sizes thereof. For example, each particle counter is able to make a classification such that, among particles measured by the particle counter, how many particles of 0.1 μm and more and less than 0.5 μm in diameter are present, how many particles of 0.5 μm and more and less than 1 μm in diameter are present, and how many particles of 1 μm and more in diameter are present. Setting a determination criterion using this function enables making a more appropriate determination. In many cases, there is such a tendency that, among particles included in a gas, the number of small particles is large and the number of large particles is small. If, without sizes of particles being distinguished, a warning is issued and the apparatus is stopped when 10 particles that do not meet the determination criterion have been counted per minute, the number of times of stopping of the apparatus becomes large, so that the apparatus may be stopped even in a case where there are no serious effects (the sizes of particles are small).

An example of providing determination criteria for the respective sizes of particles detected by the particle counter is described as follows. The situation in which the mold 1 is destroyed by particles being pinched when the mold 1 and an imprint material on the substrate 2 come into contact with each other is a case where particles included in a gas adhere to the pattern surface of the mold 1, a case where the particles adhere to a surface of the substrate 2 on which a pattern is formed, or a case where the particles adhere to both the pattern surface of the mold 1 and a surface of the substrate 2 on which a pattern is formed. It has previously been found from experimental results that the probability with which particles included in a gas in a stream adhere to a clean surface depends on the grain sizes (diameters) of particles. For example, while the probability of adherence of particles with a grain size of less than 0.5 μm is 1% or less, that with a grain size in the range of 0.5 μm or more to less than 1 μm is about 2%, that with a grain size in the range of 1 μm or more to less than 5 μm is about 10%, and that with a grain size in the range of 5 μm or more to less than 10 μm is about 30%. Since, during an imprint sequence, the substrate 2 repeats moving inside the apparatus, a gas present on the substrate 2 is in the same state as being flowing, and, a gas which is in contact with the mold 1 is moved in conjunction with the movement of the substrate 2 and is, therefore, considered to follow the above-mentioned probability of adherence.

Next, it has previously been found from experience that the probability with which a pattern of the mold is destroyed when particles are pinched between the mold and the substrate also varies depending on the sizes of particles. While the probability of destruction in the case of particles with a grain size of less than 0.5 μm is 20% or less, in the case of particles with a grain size of 5 μm or more, patterns are destroyed with a probability of 80% or more. In the case of large particles, since the destruction area for a pattern becomes broad, the possibility of becoming critical defects also increases. On the other hand, in the case of destruction of patterns by small particles, such a defect may be acceptable. As an example in which these weighting factors are also taken into consideration, determination criteria for the respective grain sizes of particles are shown in Table 1. When any one of these determination criteria for the respective grain sizes is met, a warning is issued. Determination criteria for warning at that time are also set as two stages, i.e., a determination criterion A for only a warning and a determination criterion B for a warning and automatic stopping of the apparatus. The two stages are divided into a case where, if the possibility of patterns of the mold being destroyed is at a relatively low level, only a warning is issued and the situation is checked while the imprint operation is continued and a case where, if the possibility of patterns of the mold being destroyed is high, the imprint operation is stopped.

TABLE 1

| | Grain size distribution of particles | | |
|---|---|---|---|
| | Less than 0.5 μm | 0.5 μm-5 μm | 5 μm or more |
| Probability of adherence of particles | 1% or less | About 10% | About 30% |
| Probability of destruction of mold patterns | 20% or less | About 40% | About 80% |
| Determination criterion A (only warning) | 1500 particles/CF | 75 particles/CF | 12 particles/CF |
| Determination criterion B (warning + stopping) | 5000 particles/CF | 250 particles/CF | 40 particles/CF |

CF: Cubic feet

Such a determination method for particle detection is described with reference to a flowchart illustrated in FIG. 6. In step 60, the imprint apparatus IMP inputs a measurement value obtained by the particle counter (a result of detection). The particle counter sends a numerical value about the particles measured for every previously set time (unit time) or for every previously set volume of the suctioned gas (unit volume) to the particle counter control unit 36. In step 61, a determination unit (not illustrated) included in the particle counter control unit 36 compares the measurement value with a previously set determination criterion B, and, if the number of particles larger than the numerical value of the determination criterion B has been counted (NO in step 61), the determination unit determines that abnormal particle generation has occurred, and then notifies the main control unit 30 of the occurrence of abnormal particle generation. In step 62, the main control unit 30, which has received a notification of the occurrence of abnormal particle generation, gives a warning of the occurrence of apparatus abnormal situation (performs error processing). For example, the main control unit 30 displays such a warning content on a display unit such as an operation screen provided in the imprint apparatus IMP. Then, in step 66, the imprint apparatus IMP promptly stops an imprint sequence which is in process, and performs a stopping operation (performs error processing) such as an operation of moving the substrate from a substrate chuck to another place.

If, as a result of comparison with the determination criterion B in step 61, the measurement value is less than or equal to the numerical value of the determination criterion B (YES in step 61), then in step 63, the determination unit included in the particle counter control unit 36 compares the measurement value with a previously set determination criterion A. If, as a result of comparison with the determination criterion A in step 63, the measurement value is less than or equal to the numerical value of the determination criterion A (YES in step 63), the processing returns to step 60, in which the imprint apparatus IMP inputs a new measurement value obtained by the particle counter. If, as a result of comparison with the determination criterion A in step 63, the number of particles larger than the numerical value of the determination criterion A has been counted (NO in step 63), the determination unit determines that abnormal particle generation has occurred, and, in step 64, the main control unit 30, which has received a notification of the occurrence of abnormal particle generation, gives a warning of the occurrence of apparatus abnormal situation (performs error processing). In a case where the measurement value has been compared with the determination criterion A, basically, only the issuance of a warning is performed.

However, even in the case of only the issuance of a warning, if the warning is continued or the warning is frequently issued, the imprint apparatus IMP is able to determine that the imprint operation is to be stopped. For example, if, in step 65, it is determined that the measurement value has exceeded the determination criterion A four more times within 30 minutes after a warning of the occurrence of apparatus abnormal situation is issued in step 64 (NO in step 65), then in step 66, the imprint apparatus IMP promptly stops an imprint sequence which is in process. The determination criterion for use in step 65 is not limited to this example. For example, if the measurement value exceeds the determination criterion A, when a measurement value obtained by accumulation for 10 minutes including the preceding measurement value has reached the numerical value of the determination criterion B, it is also favorable to stop an imprint operation and check the state of the apparatus. In this way, providing criteria in two stages enables performing a more appropriate operation.

After, in step 66, stopping an imprint sequence, then in step 67, the imprint apparatus IMP carries out the substrate to the outside of the imprint apparatus IMP, and, in step 68, the imprint apparatus IMP temporarily stops an imprint operation of the imprint apparatus IMP. The operator of the imprint apparatus IMP can check the pattern state of the substrate processed at the time of issuance of the warning or take out the mold from the apparatus and check the pattern of the mold. In this way, the operator temporarily stops the imprint apparatus IMP, performs checking of the state of generation of particles, such as checking of the state of particles adhering to the mold or the substrate, and, as needed, takes measures to remove particles by, for example, cleansing the apparatus.

Accordingly, the imprint apparatus according to the fourth exemplary embodiment immediately stops an imprint operation when particles which are likely to cause defects of the mold have been generated, thus being able to reduce breakage of the mold. Moreover, the imprint apparatus according to the fourth exemplary embodiment is able to detect particles generated near the mold, which influence pattern formation, and is able to stop an imprint operation so as to reduce the occurrence of pattern defects caused by the particles.

Furthermore, while, in the above-described exemplary embodiments, a mold for pattern transfer with a raised and recessed pattern formed thereon has been described as an example of the mold 1, a mold having a flat surface portion on which no raised and recessed pattern is formed (a blank template) can also be used. The blank template is used for a planarization apparatus which performs molding with the flat surface portion in such a way as to planarize a composition on the substrate. Thus, any of the above-described exemplary embodiments can also be applied to a molding apparatus which molds a composition on a substrate with use of a mold.

Furthermore, in the above-described exemplary embodiments, a processing operation for issuing a warning and a processing operation for stopping the processing which forms a pattern on the substrate have been described as examples of the error processing. However, the error processing is not limited to these processing operations, but processing for varying the amount of supply of a clean gas which is supplied to the inside of the imprint apparatus and thus removing particles can be performed.

While, in the above-described imprint apparatuses, an imprint method of curing (hardening) an imprint material with use of a light curing method has been described, the above-described exemplary embodiments are not limited to the use of the light curing method, but a method of curing an imprint material with use of heat can be employed. In the light curing method, an ultraviolet curable resin is used, ultraviolet light is radiated onto the resin in the state in which a mold is pressed against a substrate via the resin, so that the resin is cured, and, then, the mold is released from the cured resin, so that a pattern is formed. While, in the above-described exemplary embodiments, ultraviolet light is radiated as curing light, the wavelength of light can be determined as appropriate depending on an imprint material which is supplied onto the substrate. On the other hand, in the method using heat, a thermoplastic resin is heated to a temperature higher than or equal to the glass-transition temperature, a mold is pressed against a substrate via the resin in the state in which the liquidity of the resin is increased, and, after the resin is cooled, the mold is released from the resin, so that a pattern is formed.

A pattern of the hardened object formed with use of the imprint apparatus is permanently used for at least a part of various articles or is temporarily used to manufacture various articles. Examples of the article include an electrical circuit element, an optical element, a microelectromechanical system (MEMS), a recording element, a sensor, or a mold. Examples of the electrical circuit element include a volatile or non-volatile semiconductor memory, such as a dynamic random access memory (DRAM), a static random access memory (SRAM), a flash memory, and a magnetoresistive random access memory (MRAM), and a semiconductor device, such as a large-scale integration (LSI) circuit, a charge-coupled device (CCD), an image sensor, and a field-programmable gate array (FPGA). Examples of the mold include a mold for imprint.

The pattern of the hardened object is directly used as a constituent member for at least a part of the above-mentioned article or is temporarily used as a resist mask. In the process of processing a substrate, after, for example, etching or ion implantation is performed, the resist mask is removed.

Figure 7A:
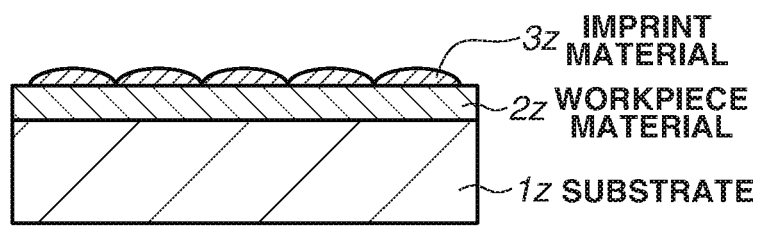
FIGS. 7A, 7B, 7C, 7D, 7E, and 7F are diagrams used to explain a method for manufacturing an article.

Next, an article manufacturing method of forming a pattern on a substrate with use of the imprint apparatus, processing the substrate with the pattern formed thereon, and manufacturing an article from the processed substrate is described with reference to FIGS. 7A, 7B, 7C, 7D, 7E, and 7F. As illustrated in FIG. 7A, the method prepares a substrate $1z$, such as a silicon wafer, with a workpiece material $2z$, such as an insulator, formed on the surface thereof, and then applies an imprint material $3z$ onto the surface of the workpiece material $2z$ with use of, for example, an inkjet method. FIG. 7A illustrates the behavior of the imprint material $3z$, which is in the shape of a plurality of droplets, being applied onto the substrate $1z$.

Figure 7B:
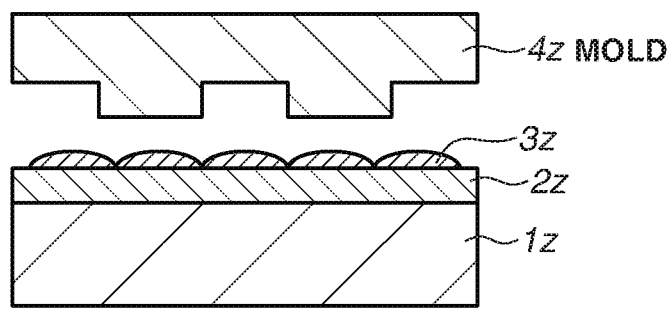
Figure 7C:
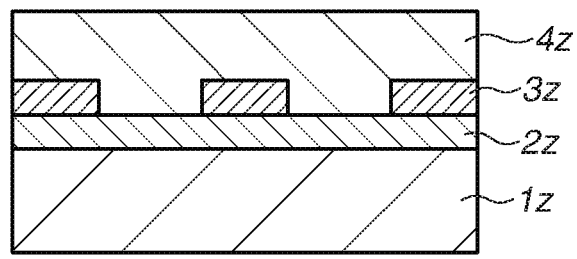

As illustrated in FIG. 7B, the method prepares a mold $4z$ for imprint in such a way as to cause a side surface thereof with a raised and recessed pattern formed thereon to face the imprint material $3z$. As illustrated in FIG. 7C, the method brings the substrate $1z$ with the imprint material $3z$ applied thereto and the mold $4z$ into contact with each other, and applies pressure to them. A clearance between the mold $4z$ and the workpiece material $2z$ is thus filled with the imprint material $3z$. Then, in this state, the method radiates light as energy for curing to the imprint material $3z$ via the mold $4z$, thus curing the imprint material $3z$.

Figure 7D:
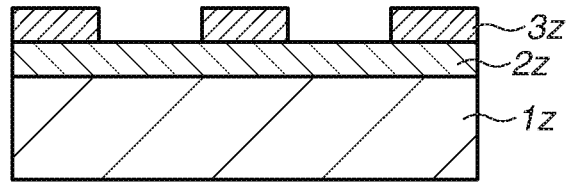

As illustrated in FIG. 7D, after curing the imprint material $3z$, the method releases the mold $4z$ from the substrate $1z$, so that a pattern of the hardened object of the imprint material $3z$ is formed on the substrate $1z$. This pattern of the hardened object has a shape in which a recessed portion of the mold corresponds to a raised portion of the hardened object and a raised portion of the mold corresponds to a recessed portion of the hardened object, and thus, this means that the raised and recessed pattern of the mold $4z$ has been transferred to the imprint material $3z$.

Figure 7E:
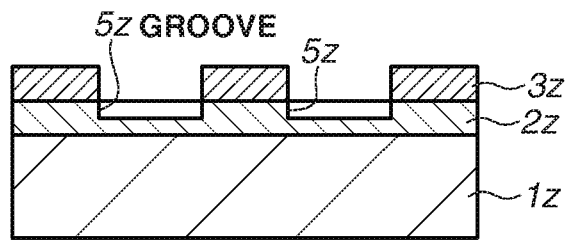
Figure 7F:
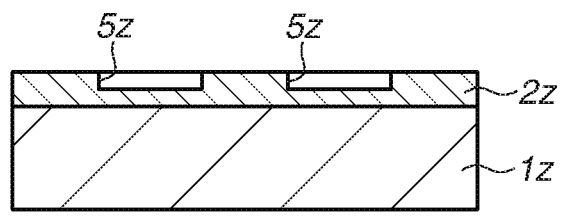

As illustrated in FIG. 7E, the method performs etching with the pattern of the hardened object used as an etching-resistant mask, so that a portion on which no hardened object is present or a thin hardened object remains of the surface of the workpiece material $2z$ is removed and is thus formed into a groove $5z$. As illustrated in FIG. 7F, the method removes the pattern of the hardened object, thus obtaining an article with the groove $5z$ formed on the surface of the workpiece material $2z$. While, here, the method removes the pattern of the hardened object, without removing that even after processing thereof, the method can utilize the pattern of the hardened object as, for example, a film for interlayer insulation included in, for example, a semiconductor device, in other words, as a constituent element of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-104911 filed May 31, 2018, which is hereby incorporated by reference herein in its entirety.

What is claimed is:

1. A method of manufacturing an article, the method comprising:
    controlling a molding apparatus that molds a composition on a substrate with use of a mold, the molding apparatus comprising:
        a mold holding unit configured to hold the mold;
        a suction unit provided at the mold holding unit and configured to suction
        a gas in a space in which the mold and the substrate face each other; and
        a detector configured to detect particles included in the gas suctioned by the suction unit,
        wherein the detector includes a particle counter configured to count a number of particles included in the gas suctioned by the suction unit,
    performing error processing including executing processing to issue a warning in a case where it is determined that the number of particles measured by the particle counter is larger than a first numerical value, and
    performing error processing including executing processing to stop processing of molding operation of the composition on the substrate by the molding apparatus in a case where it is determined that the number of particles measured by the particle counter is larger than a second numerical value, which is larger than the first numerical value.

2. A method for manufacturing an article, the method comprising:
    forming, with use of an imprint apparatus that forms a pattern of an imprint material on a substrate with use of a mold, the pattern on the substrate; and
    performing processing on the substrate with the pattern formed thereon, the method manufacturing the article from the substrate with the processing performed thereon,
    wherein the imprint apparatus includes:
        a mold holding unit configured to hold the mold;
        a suction unit provided at the mold holding unit and configured to suction a gas in a space in which the mold and the substrate face each other;

a detector configured to detect particles included in the gas suctioned by the suction unit; and a control unit configured to perform error processing depending on a result of detection performed by the detector, the detector includes a particle counter configured to count a number of particles included in the gas suctioned by the suction unit, wherein the control unit controls the following:

executing processing to issue a warning in a case where it is determined that the number of particle counter is larger than a first numerical value, and executing processing to stop processing of forming the pattern of the imprint material on the substrate in a case where it is determined that the number of particles measured by the particle counter is larger than a second numerical value, wherein the second larger numerical value is larger than the first numerical value.

3. The method according to claim 2, wherein the suction unit includes a suction port provided to suction the gas in the space in which the mold and the substrate face each other, and wherein the suction port is located around the mold held by the mold holding unit.

4. The method according to claim 3, wherein the suction port of the suction unit includes a plurality of suction ports located around the mold.

5. The method according to claim 3, wherein the imprinting apparatus further comprises an imprint material supply unit configured to supply an uncured imprint material onto the substrate, wherein the suction port of the suction unit is located in such a way as to surround the mold with respect to a scanning direction in which the substrate performs scanning between a position of the imprint material supply unit and a position of the mold holding unit.

6. The method according to claim 2, wherein the imprinting apparatus further comprises an imprint material supply unit configured to supply an uncured imprint material onto the substrate, wherein a suction port of the suction unit is located between the imprint material supply unit and the mold holding unit.

7. The method according to claim 2, wherein the imprinting apparatus further comprises a gas supply port located around the mold holding unit and configured to supply a gas with particles removed therefrom to a space in which the mold and the substrate face each other, wherein a suction port of the suction unit is located between the gas supply port and the mold holding unit.

8. The method according to claim 2, wherein the error processing includes at least one of processing for issuing a warning and processing for stopping processing which forms a pattern on the substrate.

9. The method according to claim 2, wherein, in a case where, as the result of detection performed by the detector, a result of detection of particles included in a gas for a unit time or a gas of a unit volume exceeds a previously set numerical value, the step of controlling stops an operation of the imprint apparatus.

10. The method according to claim 2, wherein the particle counter detects sizes of particles of included in the gas suctioned by the suction unit and detects numbers of particles corresponding to the respective sizes of particles, and wherein the performing error processing including executing processing to issue a warning and wherein the performing error processing including executing processing to stop processing are performed for each of the particle sizes.

* * * * *